United States Patent [19]

O'Donnell et al.

[11] Patent Number: 4,839,652

[45] Date of Patent: Jun. 13, 1989

[54] METHOD AND APPARATUS FOR HIGH SPEED DIGITAL PHASED ARRAY COHERENT IMAGING SYSTEM

[75] Inventors: Matthew O'Donnell, Schenectady; William E. Engeler, Scotia; Thomas L. Vogelsong, Schenectady; Steven G. Karr, Scotia; Sharbel E. Noujaim, Clifton Park, all of N.Y.

[73] Assignee: General Electric Company, Schenectady, N.Y.

[21] Appl. No.: 56,177

[22] Filed: Jun. 1, 1987

[51] Int. Cl.[4] .............................................. H03M 1/64
[52] U.S. Cl. .................................... 341/122; 341/123; 341/166; 364/178; 328/151; 358/138
[58] Field of Search ................. 340/347 SH, 347 AD, 340/347 M, 347 C, 347 CC; 364/178, 179; 328/151; 358/138; 375/39, 100; 341/122–125, 126, 131, 166, 155–159

[56] References Cited

U.S. PATENT DOCUMENTS

4,345,241 8/1982 Takeuchi et al. .......... 340/347 SH X
4,673,916 6/1987 Kitamura et al. ............. 340/347 SH
4,677,626 6/1987 Betts et al. .......................... 375/39 X Primary Examiner—Vit W. Miska
Assistant Examiner—Brian K. Young
Attorney, Agent, or Firm—Geoffrey H. Krauss; James C. Davis, Jr.; Marvin Snyder

[57] ABSTRACT

A method for generating an output stream of digital data words, with each data word representing the amplitude of an analog signal at one of a multiplicity F samples each second and with substantially equally spaced time intervals T therebetween, is obtained from a digital baseband demodulation system used for array beam forming. A data stream, formed of interleaved ADC output digital data words acquired from a set of converters, is at a rate of F total samples/second. Subsequent digital demodulation, filtration, and decimation provides digital output signals which need less delay resolution prior to the formation of coherent sum signals, thereby reducing overall channel memory requirements. The output baseband data stream has enhanced dynamic range, thereby reducing the ADC bit density requirements.

16 Claims, 3 Drawing Sheets

METHOD AND APPARATUS FOR HIGH SPEED DIGITAL PHASED ARRAY COHERENT IMAGING SYSTEM

BACKGROUND OF THE INVENTION

The present invention relates to coherent imaging systems using vibratory energy, such as ultrasonic or electromagnetic waves, and, more particularly, to a novel method and novel apparatus, for digital beam formation by delayed sampling and digital baseband demodulation. Our method utilizes a non-uniform clock to capture received waves in either a single high-speed analog-to-digital converter (ADC), or a plurality K of lower speed ADCs; after ADC sampling, the digital signal undergoes digital baseband demodulation in a two-stage demodulator which is followed by FIR filters and decimators to provide baseband signals at a much lower rate than the equivalent ADC clock rate.

A method and apparatus for fully digital beam formation in a phased array coherent imaging system, such as an ultrasonic medical imaging system and the like, is described and claimed in now-allowed co-pending application, Ser. No. 944,482, which was filed on Dec. 19, 1986, and is incorporated herein in its entirety by reference. The imaging system utilizes a phased array sector scanner (PASS) to rapidly and accurately sweep a formed beam of vibratory energy. The desired beam pointing accuracy is obtained by maintaining an accurate set of phase relationships, which are, in fact, a set of time delays between the various N transducer elements of the PASS array. By decoupling the required phase accuracy and time delay accuracy from one another, the signals can be coherently summed with great accuracy. However, in order to preserve both the amplitude resolution and the time resolution necessary for proper beam formation, the analog-to-digital converter (utilized for converting the analog signal from each channel transducer, at any instant, into a digital data word for processing) must carry out conversions at a sample frequency of at least two times, and usually four times, the maximum operating frequency of the imager. This requires the use of an 8-bit, 40 MHz ADC for each of the N channels (where N is on the order of 64) of an ultrasonic medical scanner; the integrated circuit chip area necessary, even utilizing VLSI implementation, is prohibitive, as is the cost. Additionally, operating at such a high sampling rate requires that a relatively large amount of high-speed random access memory be utilized to store data so that a realistic amount of steering-angle time delay can be provided in each of the N channels, prior to coherent summation across those N channels of the array. For example, if about 10 microseconds of total time delay must be obtained prior to coherent summation, an ADC sampled at 40 MHz must be accompanied by at least 400 words of high speed RAM for required data delay in each of the N channels. It is highly desirable to also reduce the operating speed and required depth of the channel time-delay RAM memory.

BRIEF SUMMARY OF THE INVENTION

In accordance with the invention, a method for generating a stream of digital data words, each representing the amplitude of an analog signal at a different one of a multiplicity F samples each second and with substantially equally spaced time intervals T therebetween, comprises: sampling an analog input signal and converting in an ADC the analog input signal amplitude to a digital data word, responsive to receipt of a sample strobe signal at a conversion rate F; then demodulating the digital output of the ADCs to baseband using a digital demodulator means, an FIR low pass filter means, and a decimator means. The output of the decimator is clocked, at a rate F' (which is much reduced from the ADC sample rate F), into storage memory for a channel time delay $t_{dj}$ necessary for beam formation. By reducing the sample rate, this digital baseband system results in smaller memories to generate the appropriate time delays, as compared to an equivalent system using the direct outputs of the ADCs for beam formation. In addition, the baseband demodulator increases the dynamic range of the digital system approximately by the factor C, where $C(dB) = 10 \log_{10}(2F/F')$ Consequently, the bit density in the ADC means can be reduced by a factor D, where $D(bits) = \frac{1}{2}(\log_2(2F/F'))$, compared to the ADC means in a system using the direct outputs of the ADC means for beam forming.

In accordance with the invention, our novel method is carried out by apparatus with means for sampling, demodulating, low pass filtering, decimating, and time delaying for digital beam forming. The sampling means always acts to convert an analog input signal to a digital word responsive to a sample clock operating at F samples per second; the conversion means can comprise either a single converter operating at F samples per second or a plurality K of converters each operating at F/K samples per second. If a plurality K of converters are used, then the sampling means also utilizes: means for coupling the input analog signal simultaneously to all converters; means for strobing each converter with a sample clock that can be shifted by an integer multiple of the master clock; and means for interleaving digital words to produce a digital stream at the master clock rate of F samples per second. That is, a plurality K of ADCs, each operating at a conversion rate of F/K, can be used to sample the signal at an equivalent rate of F samples per second, if the analog signal is simultaneously coupled to the analog inputs of all K converter means. In addition, means are provided for shifting the sample clock to each ADC by a time interval equal to an integer multiple of the master sample clock (i.e. $t = nT = n/F$). As detailed in commonly assigned co-pending application Ser. No. 944,482, incorporated herein in its entirety by reference, the master sample clock operating at F samples per second can be delayed from a master synchronization pulse by an interval $\Delta t$ with a time inaccuracy which is small compared to the period T of the clock (i.e., $\Delta t < < T$). This non-uniform sampling method produces time delays accurate to a time interval much finer than the sample clock period T. Consequently, an embodiment of the present invention using multiple ADCs must preserve this time delay accuracy while providing appropriately phased low frequency sample clocks to the plurality K of ADC means. After the sampling means, the digital word will be processed by means for digitally demodulating the data stream to the baseband; means for digitally low pass filtering the output of the demodulator to suppress all unwanted sidebands; means for decimating the output of the low pass filter to provide in-phase I and quadrature-phase Q data at a sample rate F' much lower than the master clock rate of F samples per second; and storage means for providing time delays.

In a presently preferred embodiment of our novel method and apparatus, each of N=64 channels has a similar front end portion each with a pair of ADCs, a digital combiner and demodulator, low pass filter, decimator and delay means. The various means, along with a channel logic means for each channel, and master logic means for controlling the whole front end, can be integrated into a semiconductor monolithic circuit, if desired.

The foregoing invention will be described with particular emphasis to one energy form, e.g. ultrasonic mechanical vibrations, in a presently preferred embodiment; it should be understood that this energy form is exemplary and not delimiting.

Accordingly, it is an object of the present invention to provide a novel method for sampling a received vibratory energy beam, received from a selected location to which the beam has been steered to and focussed at (with respect to the plane of a transducer array), of that portion of the beam energy at each of the transducers of the array, by at least one analog-to-digital converter, and subsequent digital combination, demodulation, low pass filtration, decimation, time delay and summation to provide a digital baseband representation of the received beam thereof.

It is another object of the present invention to provide novel apparatus for sampling a received vibratory energy beam, received from a selected location to which the beam has been steered to and focussed at (with respect to the plane of a transducer array), of a portion of the beam energy at each of the transducers of the array, by at least one analog-to-digital converter, and subsequent digital combination, demodulation, low pass filtration, decimation, time delay and summation to provide a digital baseband representation of the received beam thereof.

These and other objects of the present invention will become apparent to those skilled in the art upon reading of the following detailed description of the invention, when considered in conjunction with the appended drawings.

DETAILED DESCRIPTION OF THE INVENTION

Figure 1:
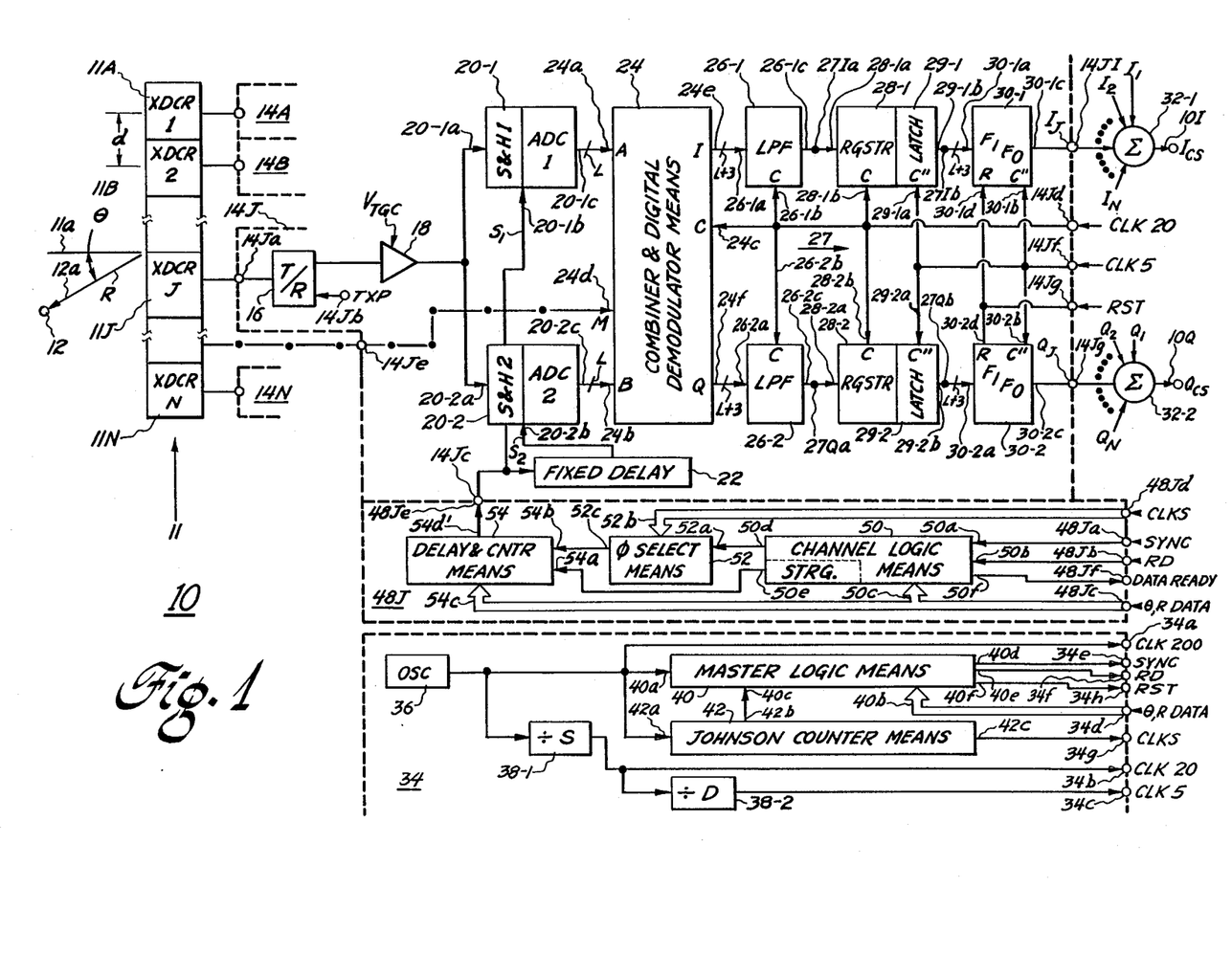
FIG. 1 is a schematic block diagram of the front end of a PASS vibratory energy (ultrasonic) imaging system in accordance with the principles of the present invention.

Referring initially to FIG. 1, in a phased-array sector scanning (PASS) vibratory energy (e.g. ultrasonic) imaging system 10, a front end transducer array 11 is comprised of a plurality N of individual transducers 11A through 11N, each operating, in a transmission condition, to converter electrical energy of a radio-frequency signal to a desired (e.g. ultrasonic mechanical) form of vibratory energy, and then, in a reception condition, to convert reflected (ultrasonic mechanical) vibrations to a received RF analog electrical signal, in manner well known to the art. Other forms of energy, such as electromagnetic energy (light, radio, etc.) and the like, can be equally as well utilized. The array is utilized for imaging a spatial location 12, which is at a range distance R along a line 12a at some angle $\theta$ with respect to a line 11a normal to the plane of array 11. The vibratory (ultrasonic) signal reflected from point 12 has a wavefront approaching the plane of array 11 at angle $\theta$; the received vibratory (ultrasonic) signal at any particular one of the transducers, e.g. the j-th transducer 11J (where J is one of the integers from 1 to N), produces an analog electrical signal which is made available at the input 14Ja of the j-th channel portion 14J of the system. Within each of the N substantially identical channel portions 14 is a transmit-receive (T/R) switching means 16, which, in the transmission condition, connects a transmit RF energy pulse signal TXP, at a channel transmit input 14Jb, to the channel transducer terminal 14Ja for RF excitation of the transducer. In the reception condition, T/R switching means 16 connects transducer terminal 14Ja to a time-gain-controlled (TGC) amplifier means 18, with gain responsive to the amplitude of a TGC control signal $V_{TGC}$ derived in manner well known to the art.

In accordance with one principle of the present invention, the signal received from each transducer (after TGC amplification, if desired) is then, in the front end portion for that channel J, provided in parallel to the analog input of each of a pair of analog-to-digital conversion (ADC) means 20. A plurality K of ADCs, each operating at a frequency F/K, can also be used. Each of the high-speed ADC means 20 samples and holds that amplitude of an analog signal then at its analog input 20-a when a sample signal is enabled, at a sample input 20-b, and automatically provides a L bit-wide parallel data word at a digital output 20-c therefor. In each channel front end means 14J, each of the pair of ADC means 20 receives a different strobe signal $S_j$. The strobe $S_2$ to the second ADC means 20-2 is staggered from the first by a time interval (=1/F, where F is the master sample rate). In the illustrated embodiment, a 40 MHz. sampling rate is achieved by interleaving samples to a pair of 20 MHz. sampling rate ADC means, the offset increment time is $t_d = 1/F = 1/40$ MHz. $= 25$ nSec., and this delay offset time of 25 nSec. is realized in a fixed delay means 22. Therefore, the first sample $S_1$ signal, received at front end input 14Jc, is provided directly to the sample $S_1$ input 20-1b of a first ADC means 20-1, which receives the analog signal at its analog input 20-1a for conversion to a L-bit-wide digital data word at its digital output 20-1c. The input sample $S_1$ signal pulse is delayed by $t_d(=25$ nSec) in fixed delay means 22 and is provided as a first delayed sample $S_2$ signal pulse to the sample input 20-2b of the second ADC means 20-2, which also receives the same analog signal at its input 20-2a, to provide an associated L-bit-wide digital data word at its digital output 20-2c. If, as another example, a set of N=4 ADC means, each able to convert only at about 10 MHz., was used, the respective second, third or fourth sample signals $S_2$, $S_3$ or $S_4$, would sequentially occur with respective 25, 50 or 75 nSec. delays after strobe signal $S_1$. It should be understood that a much higher frequency master clock signal (e.g. $F_m = 200$ MHz.) can be used to derive a set of lower frequency clock signals, separated by multiples of a time increment $\Delta t = 1/(2F_m)$ sufficiently small (e.g. $\Delta t = 2.5$ nSec.) to realize the necessary phase accuracy, as described in the above-mentioned co-pending application.

In accordance with another principle of the present invention, the K different input digital data signals (which are the digitized results of non-uniformly-sampled operation on the channel input analog signal by the K different ADC means 20) are combined to yield a single digital data signal which appears to have been sampled at an equivalent rate of F (where F/K is the sampling rate of any one ADC); here, this apparent rate is 40 MHz. The combined data is then demodulated into a pair of in-phase and quadrature-phased data streams. The combination and demodulation processes occur in a digital combiner and demodulator means 24. The L-bit-wide digital data word from the first ADC means digital output port 20-1c is applied to the A data input 24a of the combiner means. The L-bit-wide digital data word from the second ADC means digital output port 20-2c is applied to the B data input 24b of the combiner means. A clock CLK20 signal (at the non-uniform-sampling frequency, e.g. F/K=20 MHz.) is provided to a clock C input 24c of the demodulator means from a front end portion input terminal 14Jd. An M-bit-wide digital data word is applied to a multiplexer input 24d of the demodulator means; this cyclically-changing data word is received from the transducer array 11 itself, at each front end portion input 14Je. The content and cycle rate of the M data bits of this multiplexer word are determined by the characteristics of the transducer array 11, such as the frequency of operation thereof and the like. As the pattern characteristics of the M data bits do not change for any one transducer probe array 11, storage of the data bits in any known nonvolatile (read-only) form of memory is acceptable; in the illustrated embodiment, M=10 bits. The combiner and digital demodulator means output is a pair of digital data signals, i.e. an in-phase I data word and a quadrature-phase Q data word, of some greater data width, e.g. (L+3) bits width respectively, appearing at respective combiner means outputs 24e and 24f. Illustratively, if the ADC means 20 are a pair of 6-bit-wide, 20 MHz. ADCs (L=6), the I and Q output words are of 9-bit-width. Combiner and demodulator means 24 is more fully described hereinbelow with respect to FIG. 2. Each of the I and Q data words is digitally low-pass-filtered in an associated one of digital low pass filters 26, more fully described hereinbelow with respect to FIG. 3. Thus, the I digital data words supplied to the input 26-1a of the first low pass filter 26-1, which receives the sample clock CLK20 signal at its input 26-2b, and provides the digitally-low-pass-filtered output signal at a digital filtered output port 26-1c. Similarly, the Q digital data signal is applied to the input 26-2a of the other digital low pass filter means 26-2, which also receives the CLK20 signal at its clock C input 26-2b and provides the digitally-low-pass-filtered data word at its output 26-2c.

In accordance with another principle of the invention, the filtered data is then decimated in a D:1 summation filter, or decimator, means 27 such that only one of D sequential samples, provided by demodulator means 24, exits from the front end portion 14J. This decimation results in a further reduction of the apparent effective sampling rate by the factor of D with respect to the output clock frequency of the combiner means. For the presently preferred embodiment illustration in FIGS. 2 and 3, the combiner means output clock is the 20 MHz. clock CLK20 signal, D=4 and the decimator means output clock rate (the data rate at outputs 27Ib and 27Qb) is 5 MHz. This D(=4) rate reduction in decimator means 27 requires an additional decimator memory means, of depth D, but results in a concomitant reduction in decimated memory means requirements by a factor of D; thus, if D=4, a decimator means memory 28 has D=4 stages, but a subsequent delay register 30 needs only 400/4=100 stages of slower RAM (clocked at F/D=5 MHz) instead of 400 or more higher-speed RAM stages (clocked at 20 MHz)! Specifically, the digitally low-pass-filtered in-phase I data word is applied to a decimation means I input 27Ia and thence to the input 28-1 of an I portion register RGSTR means 28-1, while the low-pass-filtered quadrature-phase Q data word is applied to a decimation means Q input 27Qa and thence to the input 28-2a of a Q portion register RGSTR means 28-2. Both of the decimator register RGSTR means 28 receive the CLK20 signal at the clock C inputs 28-1b and 28-2b thereof. The length of each of registers 28 is equal to the decimator means 27 decimation factor (D), which is illustratively four samples long. Thus, each of registers 28 is (L+3-bits wide and contains D (e.g. four) stages. The D-th data word sequentially occurring at the output of each register is selected and temporarily held in a latch means 29-1 or 29-2 (of L+3 bits width), responsive to the output sample rate clock CLK5 signal provided to the clock C" inputs 29-1a and 29-2a thereof from third clock input 14Jf. It is this latched word which is provided at the appropriate one of the I or Q decimator means latched register output 29-1b or 29-2b, respectively, and is thus provided as the (L+3)-bit-wide decimated I data word at decimator I output 27Ib or the (L+3)-bit-wide decimated Q data word at decimator Q output 27Qb. These words are respectively provided to the respective inputs 30-1a and 30-2a of the in-phase and quadrature-phase J-th channel delay means 30-1 and 30-2, respectively. Each of these delay means is, as shown in the previously-identified copending application, a first-in-first-out (FIFO) register means. The delay registers 30, here, is of (L+3)-bits width, and is of a length (typically now of just over one hundred words) sufficient to impart the appropriate channel delay time $t_{dj}$, approximately given by the formula $t_{dj}=(j-1)(d/V)\sin\theta$, where V is velocity of the desired energy (ultrasound) propagation in the media immediate adjacent to transducers 11 and d is the spacing distance between adjacent transducers (e.g. between first and second transducers 11A and 11B, in the array, for $1\leq j\leq N$). It should be understood that the same dynamic focus and/or apodization considerations, referred to in the co-pending application, can be utilized to modify the time delay in, or completely disable, each channel. Thus, if the channel J is operational, the interval of channel delay commences with a reset RST signal (received at a channel portion input 14Jg and provided to the reset R inputs 30-1d and 30-2d of the delay FIFO means) and is of duration established by the number of cycles of the clock CLK5 signal provided from input terminal 14Jf to the delay register clock C" inputs 30-1b and 30-2b. After the required number of clock cycles, a channel delayed in-phase signal $I_j$ is provided at delay means output 30-1c, to channel output 14JI, and thence to the $I_j$ input of a N-input summer means 32-1, providing the in-phase coherent sum signal $I_{cs}$ at in-phase signal port 10-I. Also, after the required number of clock cycles, a channel delayed quadrature-phase signal $Q_j$ is provided at delay means output 30-2c, to channel output 14JQ, and thence to the $Q_J$ input of a N-input summer means 32-2, providing the quadrature-phase coherent sum signal $Q_{cs}$ at quadrature signal port 10-Q. More specifically, each decimator output in-phase and quadrature-phase data word is provided to the associated data input port 30-1a or 30-2a of the associated one of a pair of FIFO memory means 30, in each channel, with each of these memory means being utilized to establish the time delay $t_{dj}$ for that J-th one of the N channels. The input data is written into the memory in manner responsive to a memory-write strobe signal pulse at a memory-write input (not shown); the stored data is subsequently provided at the memory means output port 30-1c or 30-2c, responsive to a memory read strobe signal pulse at a memory means read data input (not shown). The memory read inputs of all of the 2N memory means, i.e. an in-phase I memory and a quadrature-phase Q memory in each of the N channels, are connected in parallel, so that all of the stored single channel data readings of a set are read out essentially simultaneously, even though each J-th channel data word is input to the J-th channel memory individually and in a sequence determined by the non-uniform sampling strobe signal sequence (itself determined by channel number J and angle $\theta$). Therefore, each memory means must have a minimum storage capacity $SC_{min}$, or depth, at least equal to the number of data words which can be provided in that time interval between a synchronization pulse (provided to a first input 48Ja of a channel logic means 48J associated with each J-th one of the N channel portions 14J) and an associated read RD pulse provided to a second input 48Jb of that channel logic means. This minimum storage capacity $SC_{min}$ is equal to the quotient of the total time interval $(t_{sj}+t_{dj})$ and inter-strobe time interval T, both of which are predetermined constants, so that minimum storage capacity of each memory is also preselectable. Because of the first-in-first-out mode of operation, each memory address port (not shown) can be of cyclic form, with the address being changed by each SYNC period strobe, write or the like pulse. The various signals for each channel can be further determined by angle $\theta$ and range R data supplied at another channel logic means input port 48Jc. A plurality of master clock signals are received at a master clock CLKS input 48Jd. Each j-th channel logic portion 48J will generate the main sample $S_j$ signal at an output 48Je (with inter-strobe time interval T, equal to the normal sampling rate, e.g. 20 MHz., of each ADC means 20). A data ready signal will be provided at a second output 48Jf to indicate that a coherent sum can be read from coherent sum in-phase and quadrature- phase outputs 10I and 10Q.

A master control means 34 has a stable oscillator means 36 to provide a master clock signal at a predetermined frequency $F_m$ (e.g. 200 MHz.). The master clock signal is provided to: a first clock CLK200 output 34a of the master control means; a first divider means 38-1, wherein the frequency is divided by an integer S; to the first input 40a of a master logic means 40; and the input 42a of a Johnson counter means 42. In the illustrated embodiment S=10; the resulting 20 MHz. clock CLK20 signal is provided to a second master control means output 34b, as well as to the input of a second divider means 38-2. This second means divides by the decimation integer D (e.g. 4) to provide a third clock CLK5 signal at a third master control means output 34c. Master logic means 40 also receives the angle $\theta$ and range R data at a second input 40b, from a master control means input 34d, and receives at input 40 a selected one of the clock phase signals from counter means first output 40b. The master logic means provides: the SYNC signal at an output 40d, to a control means output 34e; a common read RD signal at second output 40e, to a control means output 34f; and a reset RST signal at a third output 40f to a control means output 34f. The counter means output 42c supplies a plurality (e.g. 8) different phases of clock CLKS signals at output 34g.

The contents of each channel logic portion 48J is typically as described in the above-mentioned copending application, and includes: a channel logic means 50, receiving the SYNC signal at a first input 50a, the read data RD signal at a second input 50b and the angle/-range data at a third input 50c, for providing a phase-select signal at a first output 50d, a delay-set signal at a second output 50a, and the data ready signal at an output 50f; a phase select means 52 receiving the phase-select signal from channel logic means output 50d and receiving the multiple-phase master clock CLKS signals at inputs 52b, for selecting the proper phase to provide as a single output 52c signal; and a delay and counter means 54 receiving the delay control signal from channel logic means output 50e at a first input 54a, the single selected phase master clock signal at an input 54b and the angle and range data at an input 54c for providing at an output 54d the strobe signal $S_1$ with proper strobe time interval T and the proper offset time interval, with respect to the synchronization signal, which offset time interval is selected to be not greater than 1/32 of the reciprocal of the vibratory (ultrasonic) RF frequency of operation. That is, with the offset time interval being substantially independent of the inter-strobe time interval T, established by the Nyquist frequency, each sequential train of sampling pulses must be "time-slipped" in each channel by some integer multiple $X_j$ of a $\Delta t$ time interval therebetween, with the multiplier $X_j$ being selected from each J-th channel in the same manner that the channel excitation delay is selected, i.e. for any angle $\theta$ and with a known $\Delta t$, set by the master clock frequency, being $X_j=(j-1)(d/V\Delta t)\sin\theta$.

Figure 2:
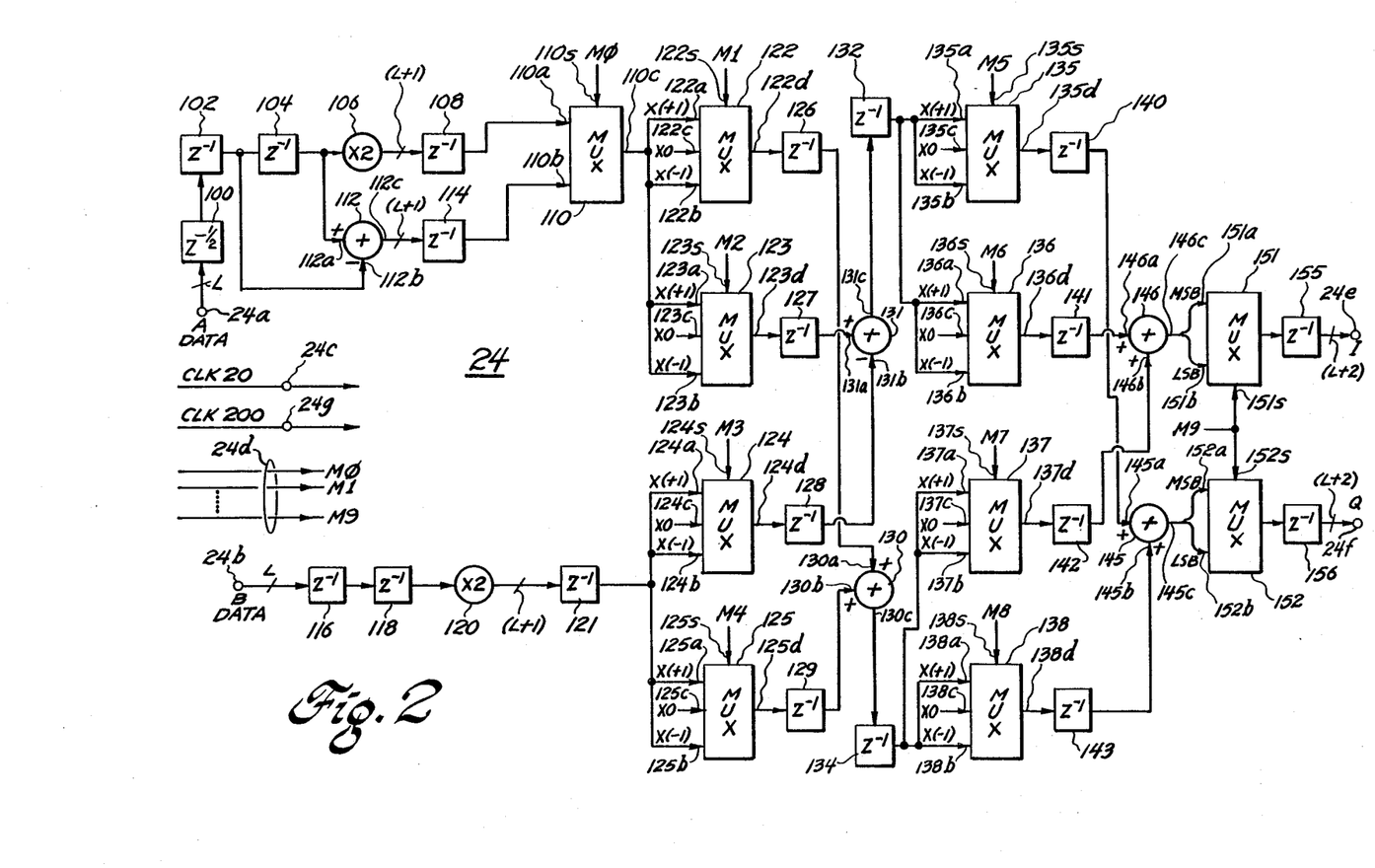
FIG. 2 is a schematic block diagram of a digital combiner and demodulator means utilized in each channel of the system of FIG. 1.
Figure 2A:
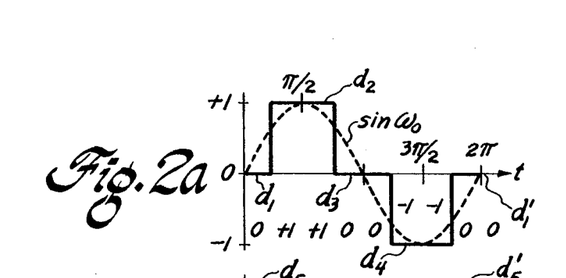
FIGS. 2a and 2b are time-coordinated waveforms illustrating a portion of the operation of the demodulator of FIG. 2.
Figure 2B:
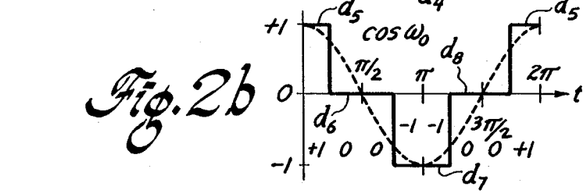

Referring now to FIG. 2, one presently preferred form of the digital combiner and demodulator means 24 includes a half-clock interval $Z^{-\frac{1}{2}}$ delay means 100, for delaying the A data word received at input 24a, and a pair of full-clock-interval $Z^{-1}$ delay means 102 and 104 for sequentially delaying the means 100 output data. The delayed data from delay means 104 is: digitally multiplied by a factor of two (i.e. is shifted one bit to the left, to become an (L+1)-bit data word); again delayed in a $Z^{-1}$ delay means 108; and then applied to a first selectable input 110a of a first multiplexer (MUX) means 110. The output of delay means 102 is digitally subtracted, in an arithmetic means 112, from the output of means 104; the difference data is delayed in means 114 and applied to the other selectable input 110b of MUX 110. The least-significant bit M0, of the time-variable M-bit data word at input 24d, is used as the MUX selection control bit at select input 110s. The selected input data appears at MUX output 110c. Simultaneously, the B data word, at input 24b, is twice delayed in means 116 and 118, multiplied by two in means 120 and again delayed in means 121. A first set of four multiplexing means MUX 122-125 are utilized as digital multipliers. The data from first MUX output 110c is applied to non-inverting X(+1) inputs 122a and 123a, and to data-converting X(−1) inputs 122b and 123b. The data output of delay means 121 is applied to the data non-inverting X(+1) inputs 124a and 125a, and to the data-inverting X(−1) inputs 124b and 125b. All of the zero-data-output-forcing X0 inputs 122c, 123c, 124c, and 125c are configured to permanently receive logic zero data. The multiplex select inputs 122s, 123s, 124s, or 125s respectively receive the second M1, third M2, fourth M3 or fifth M4 cyclically-varying data of the Mbit-wide set of data words stored with the transducer assembly 11. The cyclically-varied data pattern at the select input causes cyclical selection of the data pattern at the three selectable inputs at a rate determined by the fluctuation of the Mx bit (x=1, 2, 3, 4); the M data acts to "modulate" the incoming data stream to provide a down-conversion mix/modulation effect upon the data pattern at the MUX means outputs 122d, 123d 124d and 125d. This can be understood by temporarily referring to FIGS. 2a and 2b, wherein the analog sin $\omega_0$ and cos $\omega_0$ signal waveforms (at the transducer excitation frequency $\omega_0$) are digitally approximated, for digital demodulation purposes, by digital multiplication by one of only three logical levels: 0, +1, −1. Thus, multiplication by a sine function is equivalent to (a) multiplication by a data zero for a modulating waveform rotation between zero and $\pi/4$ radians, resulting in a first data $d_1$ portion having a zero data word; (b) in a second data portion $d_2$,the incoming data stream is multiplied by a logic +1 value, between $\pi/4$ and $3\pi/4$ radians, to provide a data output word of value equal to the data input word; (c) is multiplied by the data zero function in a third data $d_3$ portion between $3\pi/4$ and $5\pi/4$; (d) is multiplied by a (−1) function (equivalent to inverting the logic state of each data bit) in a fourth portion $d_4$, from $5\pi/4$ to $7\pi/4$; and (e) then multiplied by the logic zero operator in the final $\pi/4$ portion $d_1'$, prior to the pattern being repeated. Similarly, the cosine modulation function is digitally approximated by multiplication by data portions $d_5$, $d_6$, $d_7$, and $d_8$, before repetition in portion $d_5$,; these data portions have data values of +1, 0, −1, 0, +1, . . . respectively. Each of the data words at the MUX means outputs 122d–125d is delayed for one clock interval in respective $Z^{-1}$ means 126–129. The delayed data word from means 126 is provided at a first input 130a of a first arithmetic means 130, having the delayed data word from the fourth delay means 129 applied to a second input 130b thereof. The sum of the pair of (L+1)-bit-wide data words is a (L+2) bit-wide data word at first adder means output 130c. Similarly, the output of the second and third delay means 127 and 128 are respectively coupled to the associated one of a first input 131a and a second input 131b of a second arithmetic means 131. The subtractive output 131c means 131 is delayed in another delay means 132, while the adder means output 130c data word is delayed in another delay means 134. The data word from delay means 132 is applied to the non-inverting, X(+1) inputs 135a and 136a and the inverting, X(−1) inputs 135b and 136b of a sixth MUX means 135 and a seventh MUX means 136, which are part of a second set of four triple-input MUX means 135–138 which acts as a second digital demodulation stage. Similarly, the data word at the output of delay means 134 is coupled to the non-inverting, X(+1) inputs 137a and 138a and the inverting, X(−1) inputs 137b and 138b of MUX means 137 and 138. The zero data inputs 135c, 136c, 137c and 138c of all four MUX means receive the zero data word pattern. The respective selection inputs 135s, 136s, 137s or 138s receive the respective sixth M5, seventh M6, eighth M7, or ninth M8 cyclically-varying data bits from the transducer probe memory. The multiplied data appears at respective MUX outputs 135d, 136d, 137d, or 138d, and is respectively again delayed for one time interval in an associated one of additional delay means 140–143. A second adder arithmetic means 145 receives the delayed data word from delay means 140, at a first input 145a, and receives at a second input 145b the delayed data word from delay means 143, to provide a summed data word, of (L+3)-bits-width, at an output 145c thereof. Simultaneously, a third adder arithmetic means 146 receives at a first input 146a the output of delay means 141, receives at its second input 146b the output of delay means 142, to provide another (L+3) bit-wide data word at summer output 146. A final pair of MUX means 151 and 152 receive the tenth transducer probe data bit M9 at the respective selection inputs 151s and 152s thereof. The data at the MUX means 151 or 152 output is selected by taking either the (L+2) most significant bits (MSB) or the (L+2) least significant bits LSB, respectively. After a one time interval delay, in respective delay means 155 or 156, the digital I data word or Q data word is provided at combiner and digital demodulator means respective output 24e or 24f.

Figure 3:
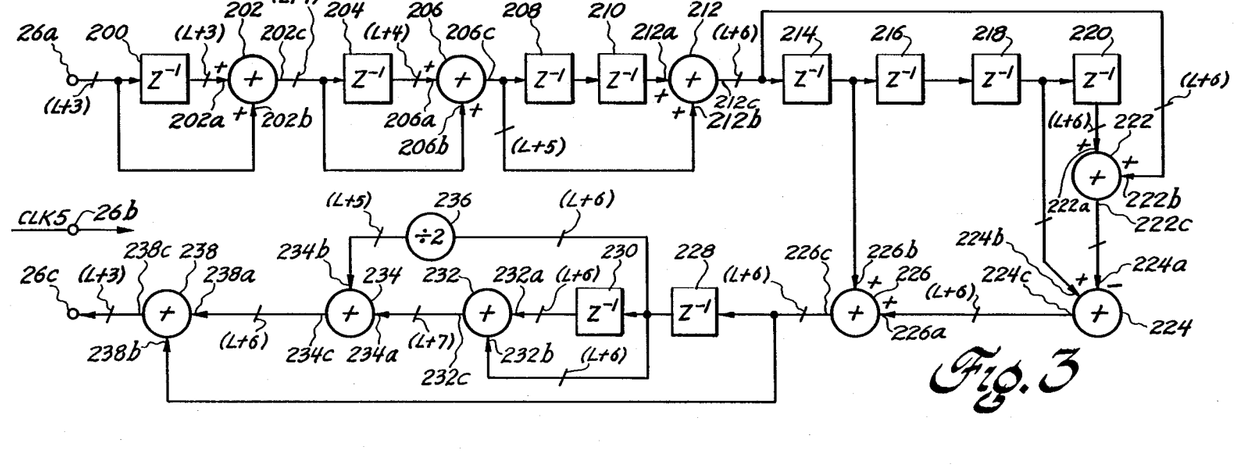
FIG. 3 is a schematic block diagram of a digital low pass filter for use in the system of FIG. 1.

FIG. 3 illustrates one presently preferred embodiment of a digital low pass filter means 26. The digital data word, from the associated one of the combiner and digital demodulator means I output 24e or Q output 24f, is received at the associated low pass filter means input 26a. This (L+3) bit-wide data word is delayed for one clock period, of the clock CLK 5 signal at filter input 26b, to provide the data at a first input 202a of a first arithmetic (adder) means 202, receiving the digital data at its second input 202b directly from filter input 26a. The data word at first adder means output 202c is further delayed in a second delay means 204. The data word from delay means 204 is applied to a second arithmetic (adder) means first input 206a, with the data word from first adder means output 202c being applied to a second adder second input 206b. The second adder means output 206c data word is twice delayed, in sequential delay means 208 and 210, to provide a data word at a third arithmetic (adder) means first input 212a. A third adder means second input 212b receives the data word from second adder means output 206c. The data word at third adder means output 212c is sequentially delayed in four separate delay means 214, 216, 218, and 220. The data word from delay means 220 is applied to a first input 222a of a fourth arithmetic (adder) means 222, which has a second input 222b receiving the data word directly from the third adder means output 212c. The data word at fourth adder means output 222c is applied to a subtractive input 224a of a fifth arithmetic (subtractor) means 224, having a second (additive) input 224b receiving the data word from the output of delay means 218. The subtrahend data word at output 224c of the subtractor means is a data word which is applied to the additive input 226a of a sixth arithmetic (adder) means 226, having a second input 226b receiving the data word from the output of delay means 214. The data word at sixth adder means output 226c is a data word which is delayed by a consecutive pair of delay means 228 and 230. A seventh arithmetic means 232 has a first input 232a receiving the output of delay means 230, and has a second input 232b receiving the output of delay means 228. The seventh arithmetic means output 232c provides a data word to a first input 234a of an eighth arithmetic means 234. The eighth arithmetic means second input 234b receives a data word from a digital divide-by-two means 236 (which operates by shifting the data word from the output of delay means 228 by one bit to the right) and dropping the right most shifted bit). The eighth arithmetic means output 234c is the data word which is applied to the first input 238a of a ninth arithmetic means 238, receiving at its other input 238b the data word from the sixth arithmetic means output 226. The (L+3)-bit-wide data word at ninth arithmetic means output 238c is the low pass filtered data word appearing at filter output 26c. It is this low pass-filtered digital data word which is decimated and then delayed by the particular channel delay necessary to allow a coherent sum of in-phase and quadrature phase data to be provided at front end outputs 10I and 10Q, respectively.

While only certain preferred features of the invention have been shown by way of illustration, many modifications and variations will now occur to those skilled in the art. It is our intent to be limited only by the scope of the appended claims and not by the specific details and instrumentalities presented by way of explanation of a single presently preferred embodiment herein.

What we claim is:

1. A method for digitally forming a beam of energy substantially focussed at a range R at an angle $\theta$ with respect to a transducer array having a plurality N of transducers, each in a separate channel and receiving a portion of the beam energy, comprising the steps of:
    (I) separately generating for each j-th channel, where $1 \leq j \leq N$, a stream of digital baseband data signals comprised of consecutive data words occurring at a first rate of F' samples per second with a substantially equally spaced first time interval T' between any sequential pair of data words, with each digital baseband data signal stream representing the amplitude and phase for an analog signal, from the associated j-th transducer, sampled at a second rate of F samples per second, where F is greater than F', and with a substantially equally spaced second time interval T between any sequential pair of samples, where T is less than T', by the steps of:
    (a) separately converting the amplitude of that j-th analog signal to a stream of digital data words each responsive to a sample strobe S signal at a maximum conversion rate equal to the second rate of F samples per second;
    (b) separately digitally demodulating the stream of data words for that j-th channel to obtain a stream of j-th channel baseband data words;
    (c) separately digitally lowpass filtering each j-th channel stream of baseband data words; and
    (d) separately decimating the j-th channel stream of filtered data words by a selected decimation factor D, which is substantially constant with respect to both time and channel number, to obtain a j-th channel output stream of data words each occurring at the reduced first rate of F' samples per second;
    (II) separately delaying each j-th channel output data word stream by a selected channel delay time interval, which may be different for each different channel, responsive to the predetermined range R and angle $\theta$; and
    (III) coherently summing all N of the separately-delayed decimated output data word streams to obtain a single set of digital baseband data words representing at least amplitude information from the formed energy beam.

2. The method of claim 1, wherein the decimating step (d) includes the steps of: (d1) storing at least D consecutive filtered data words; and (d2) selecting every D-th sequential one of the stored digital data words for inclusion in the output data signal.

3. The method of claim 1, wherein step (b) further includes the step of separating the digital data word stream in each separate channel into a stream of sequential in-phase I signal data words and a stream of sequential quadrature-phase Q signal data words.

4. The method of claim 3, wherein step (c) includes means for separately digitally lowpass-filtering each of the streams of I and Q digital data words in each channel.

5. The method of claim 4, wherein step (d) comprises the step of separately decimating the streams of I and Q digital data words by the selected decimation factor D, to provide each of a decimated I output data signal and a decimated Q output data signal, each containing data words at the reduced sample rate F'.

6. The method of claim 5, wherein the decimating step includes the steps of: (d1) separately storing at least D consecutive digital data words for each of the I and Q data streams in each channel; (d2) selecting every D-th sequential one of the stored I digital data words in each channel for inclusion of the output I data signal for that channel; and (d3) selecting every D-th sequential one of the stored Q digital data words in each channel for inclusion in the output Q data signal for that channel.

7. The method of claim 5, wherein each of the plurality N of separate channels has a different analog signal input which is converted, demodulated, filtered and decimated to a pair of I and Q output data signals for that channel, and step II further comprises the steps of: separately delaying the I and Q output data signals of each channel by the selected channel delay time interval; coherently summing all of the delayed output I data signals to provide a total I output data signal; and coherently summing all of the delayed output Q data signals to provide a total Q output data signal.

8. The method of claim 1, wherein step (a) comprises the steps of: (a1) providing in each channel a plurality K of means each of converting an analog input signal amplitude to a digital data word responsive to receipt of a sample strobe $S_k$ signal at a maximum conversion rate less than the second rate F; (a2) coupling the input analog signal for that channel simultaneously in common to the analog inputs of all K converting means for that channel; (a3) causing the j-th converting means, where $1 \leq j \leq K$, to sample the common analog signal at the occurrence of each associated j-th different one of a like plurality K of sample strobe $S_j$ signal cylically provided with a progressively greater delay offset time interval $T_{sj} = j \times t_d$, where $t_d = 1/F$, from a common synchronization event occurring at a frequency substantially equal to F/K sample/second; (a4) forming a stream of digital data words by acquiring, in cyclic sequence in a rate of F total samples per second of interleaved digital data words, the data word then being provided by that j-th one of the K converting means then sampling the common analog signal in that channel; and (a5) providing the acquired digital word stream as the output stream for digital demodulation in that channel.

9. Apparatus for digitally forming a beam of energy substantially focussed at a range R and angle $\theta$ with respect to a transducer array having a plurality N of transducers, each in a separate channel and receiving a portion of the beam energy, comprising:

(I) means for separately generating for each j-th channel, where $1 \leq j \leq N$, a stream of digital baseband data signals comprised of consecutive data words occurring at a first rate of F' samples per second with a substantially equally spaced first time interval T' between any sequential pair of data words, with each digital baseband data signal stream representing the amplitude and phase of an analog signal, from the associated j-th transducer, sampled at a second rate of F samples per second, where F is greater than F', and with a substantially equally spaced second time interval T between any sequential pair of samples, where T is less than T' and including:

(a) means for separately converting the amplitude of that j-th analog signal to a stream of digital data words each responsive to a sample strobe S signal at a maximum conversion rate equal to the second rate F of samples per second;

(b) means for separately digitally demodulating the stream of data words for that j-th channel to obtain a stream of j-th channel baseband data words;

(c) means for separately digitally lowpass filtering each j-th channel stream of baseband data words; and (d) means for separately decimating the j-th channel stream of filtered data words by a selected decimation factor D, which is substantially constant with respect to both line and channel number, to obtain a j-th channel output stream of data words each occurring at the reduced first rate of F' samples per second;

(II) means for separately delaying each j-th channel output data word stream by a selected channel delay time interval, which may be different for each different channel, responsive to the predetermined range R and angle $\theta$; and (III) means for coherently summing all N of the separately-delayed decimated output data word streams to obtain a single set of digital baseband data words representing at least amplitude information from the formed energy beam.

10. The apparatus of claim 9, wherein each of said decimating means includes: means for storing at least D consecutive digital data words; and means for selecting every D-th sequential one of the stored digital data words for inclusion in the decimated data signal of that channel.

11. The apparatus of claim 9, wherein said demodulation means further includes the means for separating the digital data word stream in each separate channel into a stream of sequential in-phase I signal data words and a stream of sequential quadrature-phase Q signal data words.

12. The apparatus of claim 11, wherein said filtering means includes means for separately digitally low-pass filtering each of the streams of I and Q digital data words in each channel.

13. The apparatus of claim 12, wherein said decimating means comprises means for separately decimating the streams of I and Q digital data words by the selected decimation factor D, to provide each of a decimated I output data signal and a decimated Q output data signal, each containing data words at the reduced sample rate F'.

14. The apparatus of claim 13, wherein said decimating means includes: means for separately storing at least D consecutive digital data words for each of the I and Q data streams in each channel; means for selecting every D-th sequential one of the stored I digital data words in each channel for inclusion of the output I data signal for that channel; and means for selecting every D-th sequential one of the stored Q digital data words in each channel for inclusion in the output Q data signal for that channel.

15. The apparatus of claim 13, wherein each of the plurality N of separate channels has a different analog signal input which is converted, demodulated, filtered and decimated to a pair of I and Q output data signals for the channel, and further comprises: means for separately delaying the I and Q output data signals of each channel by the selected channel delay time interval; means for coherently summing all of the delayed output I data signals to provide a total I output data signal; and means for coherently summing all of the delayed output Q data signals to provide a total Q output data signal.

16. The apparatus of claim 9, wherein said converting means comprises: means for providing in each channel a plurality K of means each for converting an analog input signal amplitude to a digital data word responsive to receipt of a sample stroke $S_k$ signal at a maximum conversion rate less than the second rate F; means for coupling the input analog signal for that channel simultaneously in common to the analog inputs of all K converting means for that channel; means for causing the j-th converting means where $1 \leq j \leq K$, to sample the common analog signal at the occurrence of each associated j-th different one of a like plurality K of sample strobe $S_j$ signal cyclically provided with a progressively greater delay offset time interval $T_{sj} = j \times t_d$, where $t_d = 1/F$, from a common synchronization event occurring at a frequency substantially equal to F/K sample/-second; means for forming a stream of digital data words by acquiring, in cyclic sequence in a rate of F total samples per second of interleaved digital data words, the data word then being provided by that j-th one of the K converting means then sampling the common analog signal in that channel; and means for providing the acquired digital word stream as the output stream for digital demodulation in that channel.

* * * * *